United States Patent [19]

Fujimaki et al.

[11] Patent Number: 5,309,460
[45] Date of Patent: May 3, 1994

[54] SEMICONDUCTOR LASER WITH ENCAPSULATED LEAD MEMBERS

[75] Inventors: Yoshitsugu Fujimaki, Kanagawa; Kenji Nagashima, Tokyo; Morito Yokoyama, Hyogo; Kunio Tsuboi, Saitama; Toshihiro Imai, Kanagawa; Atsushi Ogasawara, Kanagawa, all of Japan

[73] Assignee: Sony Corporation, Tokyo, Japan

[21] Appl. No.: 914,961

[22] Filed: Jul. 15, 1992

[30] Foreign Application Priority Data

Jul. 17, 1991 [JP] Japan ............................ 3-055507[U]
Oct. 21, 1991 [JP] Japan ............................ 3-085590[U]

[51] Int. Cl.$^5$ .................................................. H01S 3/04
[52] U.S. Cl. ...................................... 372/36; 257/99; 257/100; 257/787; 257/796
[58] Field of Search ................... 372/36; 257/99, 100, 257/787, 796

[56] References Cited

U.S. PATENT DOCUMENTS 5,140,384  8/1992  Tanaka ............................. 257/796

Primary Examiner—James W. Davie
Attorney, Agent, or Firm—Jerry A. Miller

[57] ABSTRACT

A semiconductor laser device is comprised of a first lead member having a mounting portion for mounting a semiconductor laser, at least one second lead member to be connected to the semiconductor laser, and a resin mold member for unitarily molding the first and second lead members, wherein the resin mold member has a recess portion for receiving the semiconductor laser therein and for exposing therein the mounting portion of the first lead member and a part of the second lead member, and wherein the semiconductor laser is electrically connected to the first and second lead members within the recess portion.

28 Claims, 9 Drawing Sheets

SEMICONDUCTOR LASER WITH ENCAPSULATED LEAD MEMBERS

BACKGROUND OF THE INVENTION

1. Field of the Invention

The present invention relates to semiconductor laser devices and, more particularly, is directed to a semiconductor laser device in which a lead member having a mounting portion for a semiconductor laser and other lead members are unitarily molded by a resin mold.

2. Description of the Prior Art

Semiconductor laser devices have been employed in various fields such as a light source of a recording/reproducing apparatus for an optical disk, magneto-optical disk or the like.

The ordinary semiconductor laser device includes a semiconductor laser and a photo detecting element such as a photo diode for monitoring an illumination state of the semiconductor laser so as to control the semiconductor laser to thereby automatically control an output power thereof at a constant level. In the ordinary semiconductor laser device, both the semiconductor laser and photo detecting element are sealed in a can package.

In the can package sealing, for example, three leads are extracted from the semiconductor laser and the photo diode. Among the three leads, two leads respectively serve as two power supply terminals for the laser and diode, and remaining one lead serves as one common terminal for the laser and diode. Both the semiconductor laser and the photo diode are mounted on a header portion, and the header portion is covered by a can having a window sealed by a glass plate for passing a front light beam radiated from the laser. Both the header portion and the can are sealed with each other.

The thus constituted can package sealing has a disadvantage that assembling processes such as a positioning process for respective parts and a sealing process between the header and can are troublesome.

In contrast, there has been proposed such a semiconductor laser device as shown in FIG. 1 which has the following structural features.

Referring to FIG. 1 of the accompanying drawings, a semiconductor laser LD is mounted on a sub-mount substrate 1 made of silicon or the like together with a photo detecting element, for example, photo diode PD for receiving a laser beam radiated from the semiconductor laser so as to monitor the laser beam. The sub-mount substrate 1 is mounted, that is, die bonded on a lead 3 which penetrates through a resin substrate 2. Respective electrodes of the semiconductor laser LD and the photo diode PD are connected via lead wires 4 to other two leads 3 which also penetrate the resin substrate 2. A transparent resin mold 5 covers the lead wires, bonding portions thereof and bonding portions of both the semiconductor laser LD and the photo diode PD so as to seal them.

However, the thus constituted semiconductor laser device has disadvantages such that, in the sealing process of both the semiconductor laser LD and the photo diode PD by the resin mold 5, stress is applied to the laser and the photo diode due to shrink of the resin mold 5 or the like when it is hardened, thereby degrading the yield of the device. Further, the aberration may be caused in the laser beam generated by the semiconductor laser LD due to the flow of the resin in the sealing process and insufficient flatness of the resin surface or the like to thereby degrade the characteristic of the semiconductor laser device. Furthermore, since the resin used is required to be transparent, the material used for the resin mold is disadvantageously limited.

OBJECTS AND SUMMARY OF THE INVENTION

Accordingly, it is an object of the present invention to provide an improved semiconductor laser device in which the aforementioned shortcomings and disadvantages encountered with the prior art can be overcome.

More specifically, it is an object of the present invention to provide a semiconductor laser device of a type where leads are extracted from a semiconductor laser and, if provided, a photo diode serving as a photo detecting element for monitoring an output beam of the laser, in which assembling and manufacturing processes are simplified to improve mass productivity of the device, and degradation of the characteristics of semiconductor elements such as the semiconductor laser and the photo diode for monitoring the laser due, to a resin mold for molding the elements is substantially reduced.

As an aspect of the present invention, a semiconductor laser device is comprised of a first lead member having a mounting portion for mounting a semiconductor laser, at least one second lead member to be connected to the semiconductor laser, and a resin mold member for unitarily molding the first and second lead members, wherein the resin mold member has a recess portion for receiving the semiconductor laser therein and for exposing therein the mounting portion of the first lead member and a part of the second lead member, and wherein the semiconductor laser is electrically connected to the first and second lead members within the recess portion.

As another aspect of the present invention, a semiconductor laser device is comprised of a first lead member having a mounting portion for mounting a semiconductor laser and a photo detecting element for detecting a laser beam radiated from the semiconductor laser, at least one second lead member to be connected to the semiconductor laser and the photo detecting element, and a resin mold member for unitarily molding the first and second lead members, wherein the resin mold member has a recess portion for receiving both the semiconductor laser and the photo detecting element therein and for exposing therein the mounting portion of the first lead member and a part of the second lead member, and wherein both the semiconductor laser and the photo detecting element are mounted on the mounting portion of the first lead member and electrically connected to the second lead member within the recess portion.

Inventors of the present invention have found that the semiconductor laser device of a type where a semiconductor laser is not directly surrounded by a resin mold or a can sealing for shielding the laser from the ambient atmosphere is sufficiently high in reliability, and more stable in property thereof when compared with the semiconductor laser device wherein the semiconductor laser or the like are directly molded.

In view of this, the present invention provides the semiconductor laser device having the above-described features.

According to an example of the semiconductor laser device of the present invention, a lead having a mounting portion for mounting a semiconductor laser and terminal extracting leads are unitarily molded by a common resin mold body.

The resin mold body has a recess portion for receiving the semiconductor laser and for exposing the mounting portion for the semiconductor laser and a part of the lead extracting leads.

Within the recess portion, the semiconductor laser is mounted on the lead by way of the mounting portion and connected to the terminal extracting leads.

If a photo detecting element such as a photo diode for monitoring a laser beam radiated from the semiconductor laser is provided in addition to the semiconductor laser, both the semiconductor laser and the photo detecting element are received in the recess portion and then connected to the lead within the recess portion.

The electrodes of the semiconductor laser and the photo detecting element are electrically connected to wire bonding pad portions. In this case, the surfaces of the bonding pad portions being exposed are depositted by metal having good corrosion resistivity such as Au or Pt.

According to the thus constituted semiconductor laser device of the present invention, the semiconductor laser is not directly surrounded by a can sealing nor a resin mold, but disposed within the recess portion formed in the resin mold body for holding the lead and the terminal extracting leads, that is, within a space surrounded by the resin mold body. Thus, the semiconductor laser is prevented from being applied with stress from the resin mold body since it does not directly contact to the resin mold body, so that the semiconductor laser is prevented from being degraded and unstable in its property.

Further, since the semiconductor laser is not directly molded by the resin mold, the rein mold may be made of any kinds of material. For example, if the resin mold is made of black resin used in the normal integrated circuit (IC) package, the resin mold will be advantageous in cost and heat radiation property. It is further possible to eliminate the abberation of the laser beam radiated from the semiconductor laser due to the surface property or the like of the resin mold body.

In the present invention, the semiconductor laser and, if provided, the photo detecting element are disposed within the recess portion of the resin mold body. Thus, even when the semiconductor laser device is assembled in a driving apparatus for an optical disk or a magneto-optical disk or the like, both the semiconductor laser and the photo detecting element do not contact with other members, so that breakage of the other members and wires for connection the laser and detecting element to leads can be effectively prevented.

Furthermore, since the surface of the bonding pad portions which are exposed and connect the laser and the photo detecting element to the lead is depositted by metal having good corrosion resistivity such as Au or Pt, the semiconductor device can operate stably for a long time despite that the bonding pad portions are exposed.

The preceding and other objects, features, and advantages of the present invention will become apparent from the following detailed description of illustrative embodiments thereof when read in conjunction with the accompanying drawings, in which like reference numerals are used to identify the same or similar parts in the several views.

DESCRIPTION OF THE PREFERRED EMBODIMENTS

A semiconductor laser device according to the first embodiment of the present invention will now be described with reference to FIGS. 2 to 5.

In this embodiment, the present invention is applied to such a semiconductor laser device that a semiconductor laser LD, that is, semiconductor laser chip is unitarily mounted on a substrate together with a photo detecting element such as a photo diode PD for receiving and detecting a laser beam radiated from the semiconductor laser, for example, a laser beam radiated from a rear end face of a resonator of the semiconductor laser.

Figure 5:
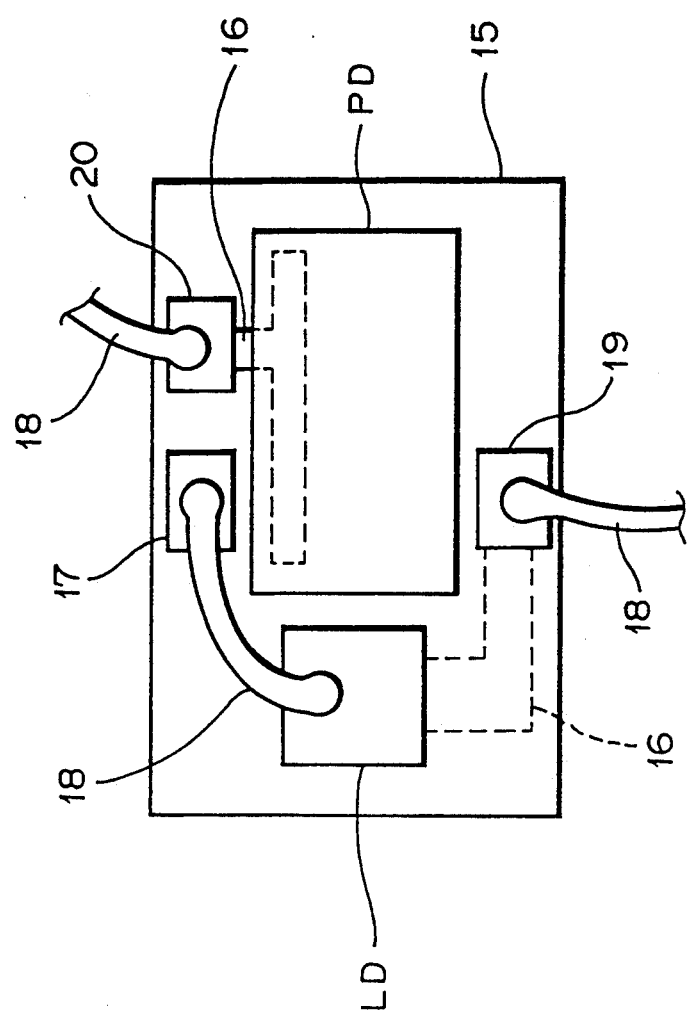
FIG. 5 is a schematic plan view of an example of a sub-mount substrate shown in FIG. 2 on which a semiconductor laser is mounted.

FIG. 5 of the accompanying drawings shows a schematic plan view of an example of a sub-mount substrate on which the semiconductor laser LD is mounted. Referring to FIG. 5, the semiconductor laser LD, e.g., various semiconductor laser elements such as a heterojunction semiconductor laser or the like is mounted on a sub-mount substrate 15 on which the photo diode PD made of Si or the like is formed.

One electrode of the semiconductor laser LD mounted on the sub-mount substrate 15 is electrically connected by way of a lead wire 18 such as a gold wire or the like to an electrode pin 17 which penetrates the sub-mount substrate 15. The one electrode of the semiconductor laser LD is then introduced to the bottom surface of the sub-mount substrate 15 together with one electrode of the photo detecting element, that is, the photo diode PD. The other electrodes of the semiconductor laser LD and the photo diode PD are electrically connected by way of wiring layers 16 or the like to wire bonding pad portions 19 and 20 provided on the sub-mount substrate 15, respectively.

The surface of the sub-mount substrate 15 is covered by an insulating layer formed of $SiO_2$ or $Si_3N_4$ or the like, but metal layers constituting the bonding pad portions 19 and 20 are exposed to the outside.

The surface, of each of the thus exposed bonding pad portions 19 and 20 is deposited by a metal surface layer made of a metal having good corrosion resistivity such as Au, Pt or the like. In this case, when the bonding pad portions 19 and 20 are made of Al or the like, if necessary, a barrier metal made of Ti or the like may be provided between the pad portions and the metal surface layer so as to prevent the reaction with Al.

Figure 4:
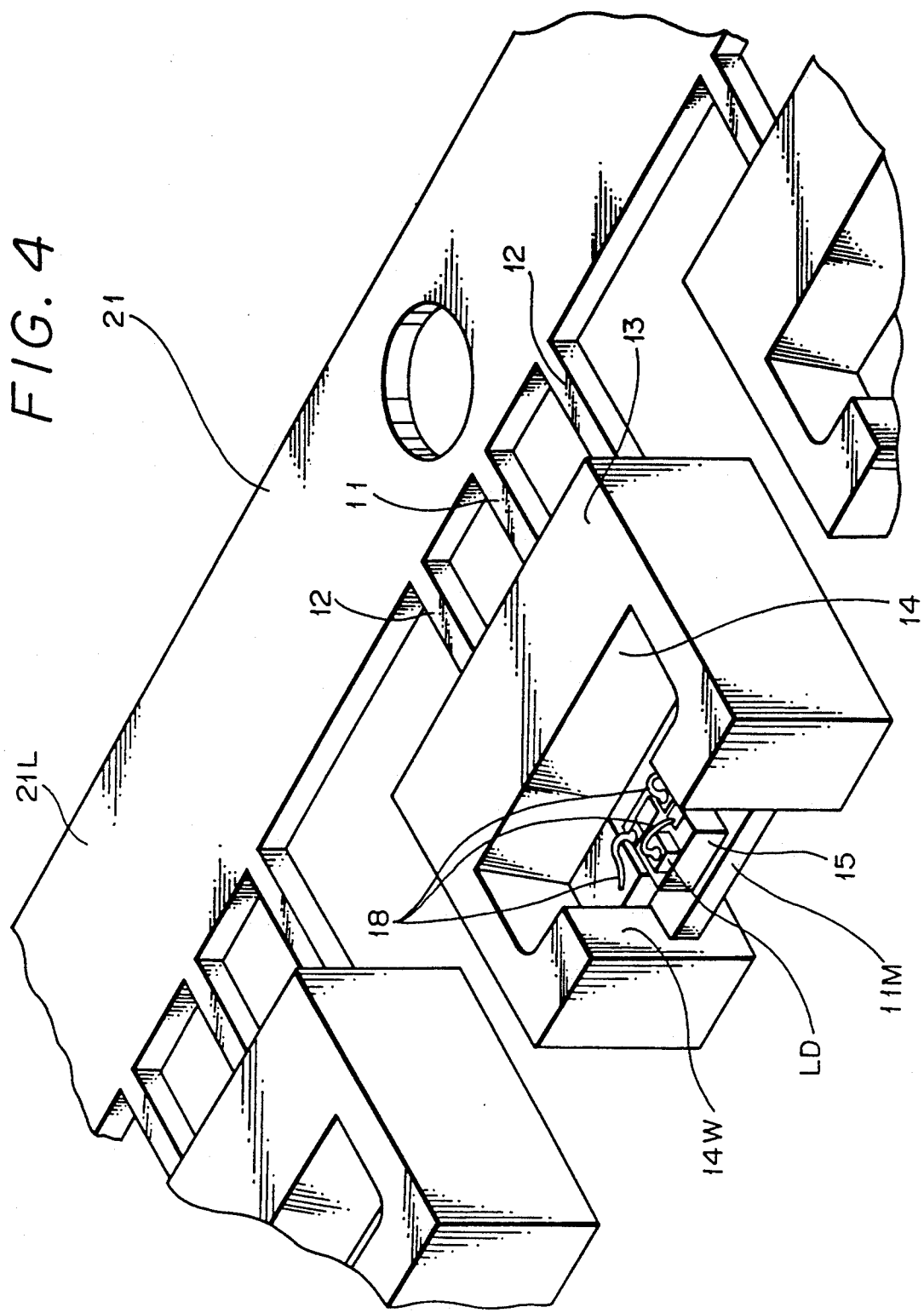
FIG. 4 is a perspective view of a lead frame for the semiconductor laser device shown in FIG. 2.

FIG. 4 of the accompanying drawings shows a perspective view of a lead frame 21 for the semiconductor laser device. The lead frame 21 is formed from a single metal sheet by a punching process or the like. Referring to FIG. 4, a lead 11 has a mounting portion 11M at a tip portion thereof on which the submount substrate 15 mounting the semiconductor laser LD, for example, is provided by a die bonding process. Two leads 12 are provided at both sides of the lead 11 so as to form other external terminal extracting leads. The lead 11 and the adjacent two leads 12 compose a set of leads. Outer ends of plural sets of leads are interconnected with one another by an interconnecting portion 21L, thereby forming the lead frame 21.

Figure 1:
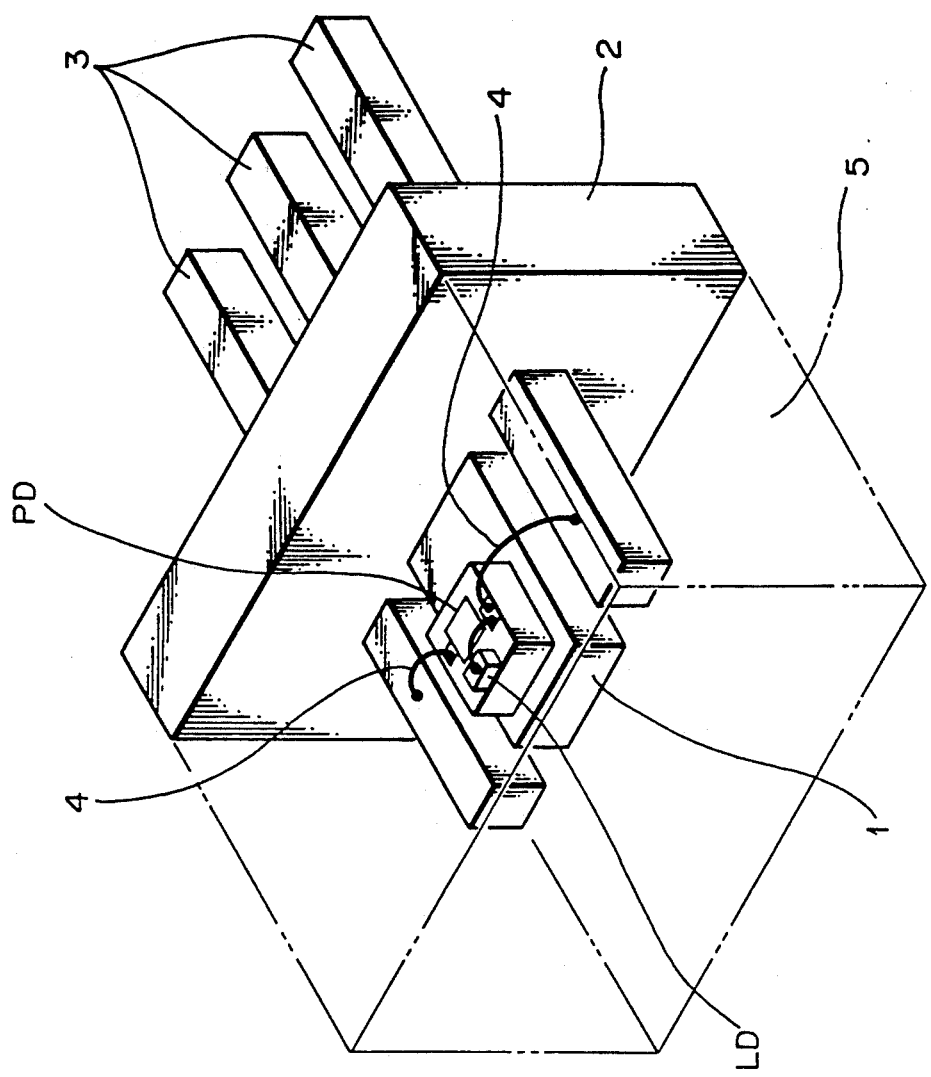
FIG. 1 is a perspective view illustrating an example of conventional semiconductor laser device.
Figure 2:
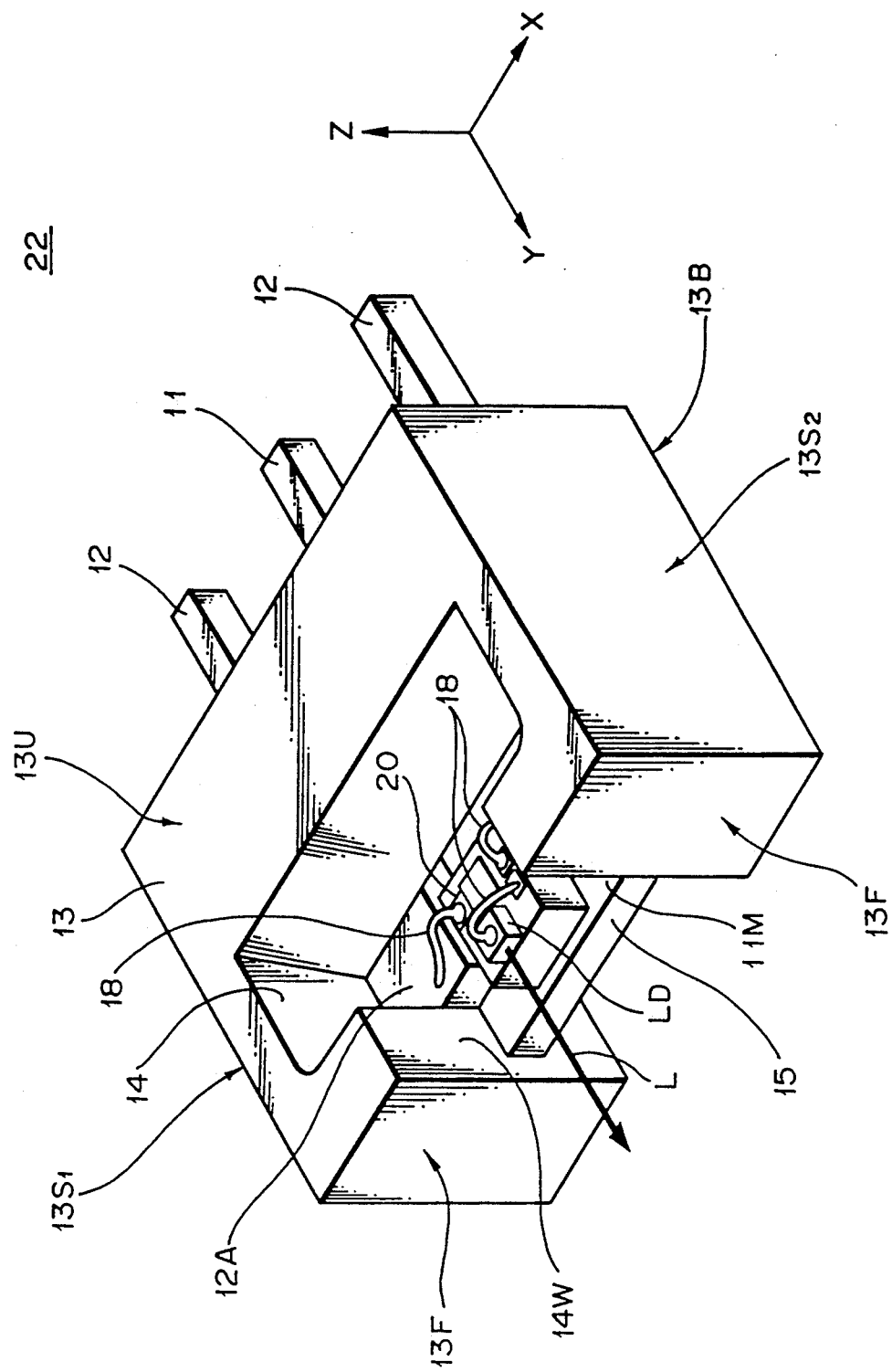
FIG. 2 is a perspective view illustrating a semiconductor laser device according to a first embodiment of the present invention.
Figure 3:
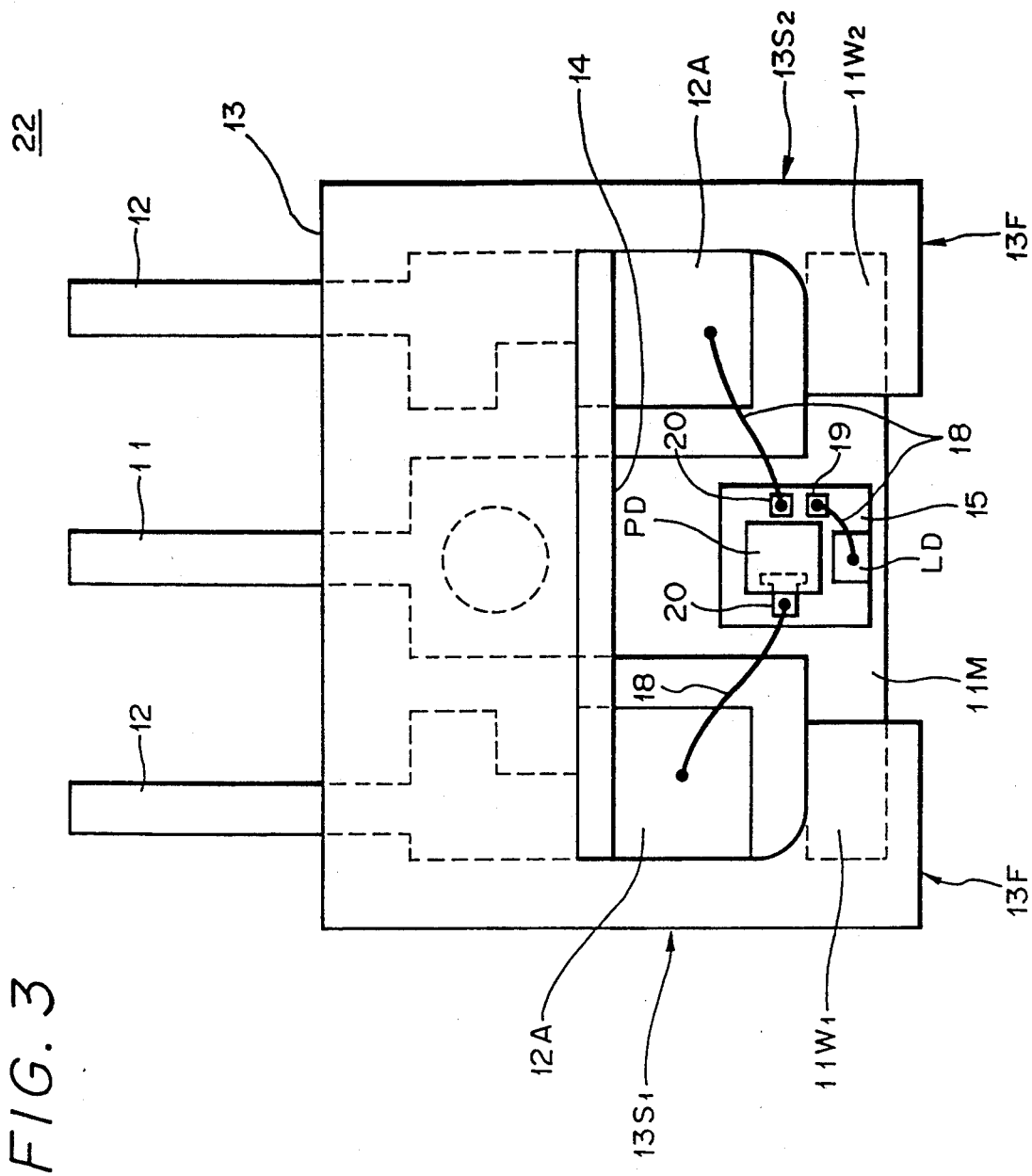
FIG. 3 is an enlarged plan view of the semiconductor laser device shown in FIG. 2.

FIG. 3 of the accompanying drawings shows an enlarged plan view of the semiconductor laser device of the first embodiment.

Referring to FIG. 3, at a mounting portion of the lead 11 for mounting the semiconductor laser LD, that is, the mounting portion 11M for mounting the sub-mount substrate 15 on which the semiconductor laser LD is mounted, there are provided wing portions 11W1 and 11W2 such that they spread to both sides of the mounting portion 11M so as to oppose to the tip portions of the leads 12 adjacent to both sides of mounting portion 11M, thereby forming the lead 11 of a T-shaped pattern.

As shown in FIG. 4, tip portions of each set of the leads, that is, the lead 11 and the adjacent two leads 12 of the lead frame 21 are unitarily molded by a resin mold body 13 made of epoxy resin or the like. Each set of the leads is then separated from the lead frame 21 in a manner that the leads of each set are mechanically coupled with one another by the resin mold body 13 such that they are held with a prescribed positional relation thereamong and electrically insulated with one another.

The resin mold body 13 is formed in general in a rectangular parallelopiped configuration and provided with a recess portion 14 in a molding process thereof. The mounting portion 11M of the lead 11 is positioned in the recess portion 14 such that its top plane is exposed to the outside. At the same time, within the recess portion 14, there are exposed parts of the leads 12 adjacent to both sides of the lead 11, e.g., tip portions of the leads 12. The tip portions of the leads 12 serve as electrode connecting portions 12A. On the electrode connecting portions 12A, the bonding pad portions 19 and 20 to which the electrodes of the semiconductor laser LD and the photo detecting element PD are connected are bonded by way of the lead wires 18 such as gold wires or the like.

The sub-mount substrate 15 mounting the semiconductor laser LD thereon is mounted on the mounting portion 11M by a die bonding process within the recess portion 14 of the resin mold body 13. The one electrodes of the semiconductor laser LD and the photo diode PD serving as the photo detecting element are electrically led to the rear surface of the sub-mount substrate 15 by way of the electrode pin 17 and then electrically connected and mechanically interconnected to the lead 11.

A front portion of the recess portion 14 of the resin mold body 13 is opened to form a window 14W so that a laser beam L radiated from the front end of the resonator of the semiconductor laser LD is directly introduced outwardly through the window 14W.

The width of the window 14W of the recess portion 14 is selected to be sufficient for passing the laser beam L radiated from the semiconductor laser LD. Further, the width of the window 14W is selected such that the tip portions of the wing portions 11W1 and 11W2 provided at both sides of the mounting portion 11M are buried within the resin mold body 13, whereby the tip portions of the lead 11 is stably held by the resin mold body 13. Thus, the semiconductor laser LD and the photo diode PD serving as the photo detecting element for monitoring the laser are stably held in mechanical connection and therefore in electrical connection.

As described above, the set of lead 11 and the adjacent two leads 12 of the lead frame 21 are molded by the resin mold body 13 by a so-called outsert molding process, and then the sub-mount substrate 15 is mounted on the mounting portion 11M of the lead 11. Further, the bonding pad portions 19 and 20 connected to the electrodes of the laser and the diode are connected to the leads 12 by way of the lead wires 18, and thereafter each set of the leads 11 and 12 are separated from the lead frame 21 at the outer end portions of the leads.

Thus, there is provided a semiconductor laser device 22 wherein the outer peripheries of the semiconductor laser LD and the photo diode PD serving as the photo detecting element for monitoring the laser beam are surrounded and protected by the resin mold body 13.

The thus constituted semiconductor laser device 22 may be assembled in a predetermined portion of an optical pickup portion of a driving apparatus for an optical disk or a magneto-optical disk or the like according to a desired usage of the device. In this case, a reference plane for setting the semiconductor laser device 22 at the predetermined portion of the optical pickup portion may be formed in the resin mold body 13.

The resin mold body 13 is formed to have such an outer configuration as a rectangular parallelopiped shape, and to have two flat front reference planes 13F at both sides of the window 14W in front of the recess portion 14 formed in the resin mold body 13 so as to sandwich the recess portion 14. The walls of the front reference planes 13F are perpendicular to the optical axis direction Y of the laser beam radiated from the semiconductor laser LD.

Further, at least one of flat side reference planes 13S1 and 13S2 is formed on at least one of the side walls of the resin mold body 13 so as to be orthogonal to the side direction X which is perpendicular to the front reference plane 13F.

Furthermore, at least one of a flat bottom reference plane 13B and a flat top reference plane 13U is formed on a bottom or top wall of the resin mold body 13 so at to be orthogonal to the front reference plane 13F and the side reference planes 13S1, 13S2.

Thus, the reference planes respectively orthogonal to the X, Y and Z directions are formed on the outer walls of the resin mold body 13.

Figure 6:
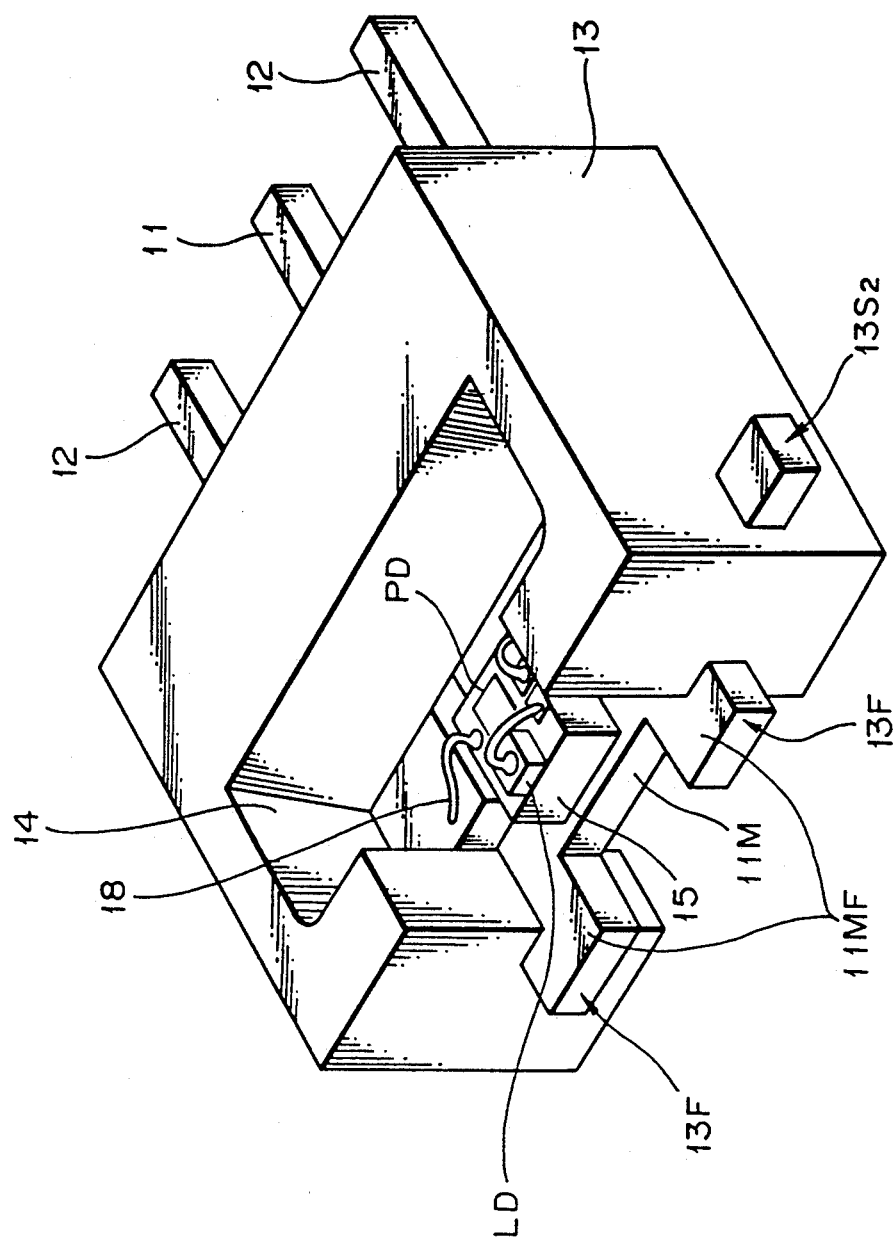
FIG. 6 is a perspective view illustrating a semiconductor laser device according to a second embodiment of the present invention.
Figure 7:
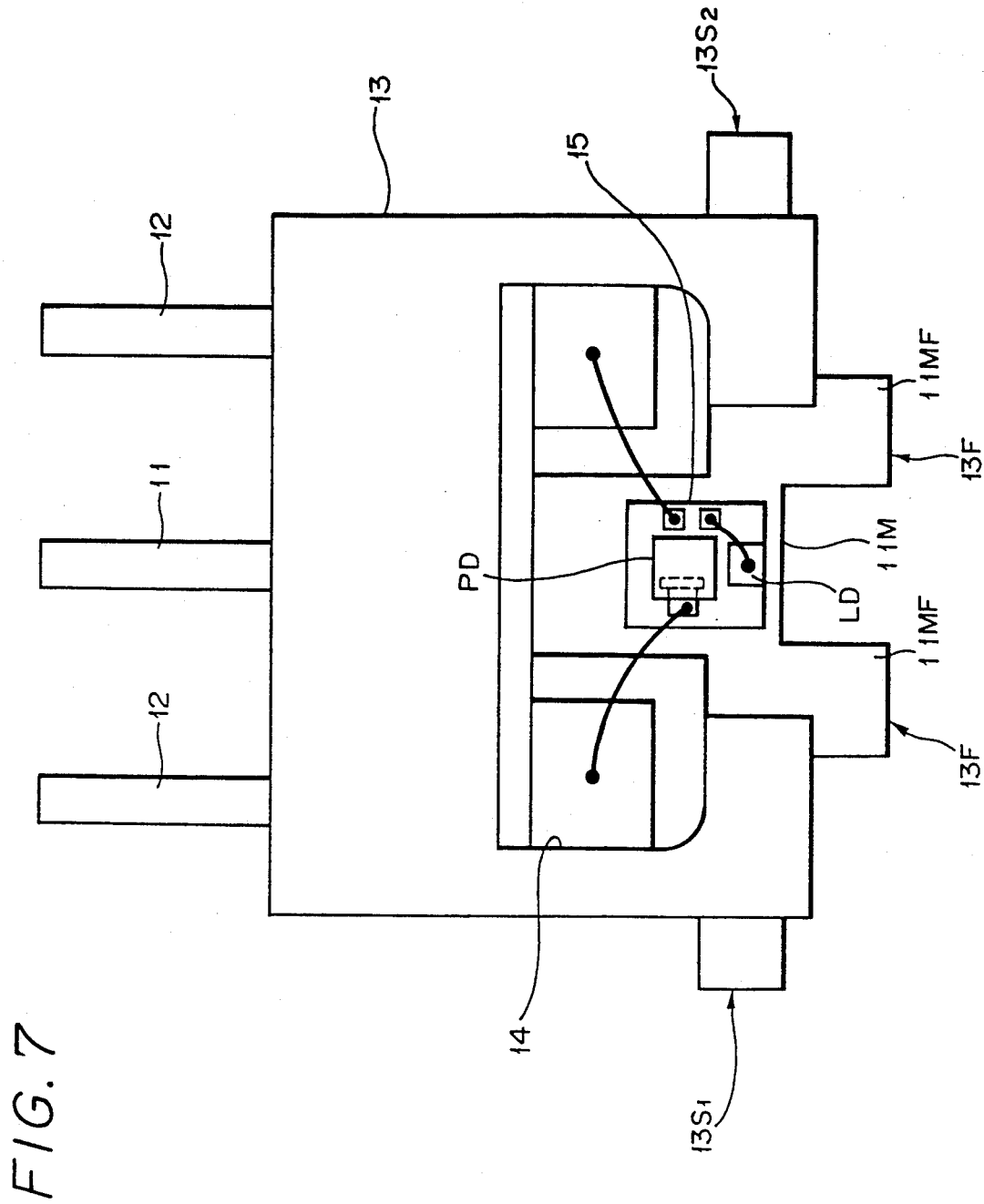
FIG. 7 is a schematic plan view of the semiconductor laser device shown in FIG. 6.

FIG. 6 of the accompanying drawings shows a perspective view of a semiconductor laser device according to the second embodiment of the present invention, and FIG. 7 of the accompanying drawings shows a schematic plan view of the semiconductor laser device shown in FIG. 6.

The second embodiment differs from the first embodiment in a point that the reference planes are not formed on the resin mold body 13 as described below.

Referring to FIGS. 6 and 7, the front tip portion of the lead 11 is divided into two portions which are extended forwardly so as to protrude from the mounting portion 11M to form two extended portions 11MF, and then front end faces of the extended portions 11MF are processed to be orthogonal to the Y direction to thereby form two front reference planes 13F. Further, the side tip portion of the lead 11 are extended to opposite side directions so as to protrude from the side walls of the resin mold body 13, and their side walls are processed to be orthogonal to the X direction to thereby form side reference planes 13S1 and 13S2.

Figure 8:
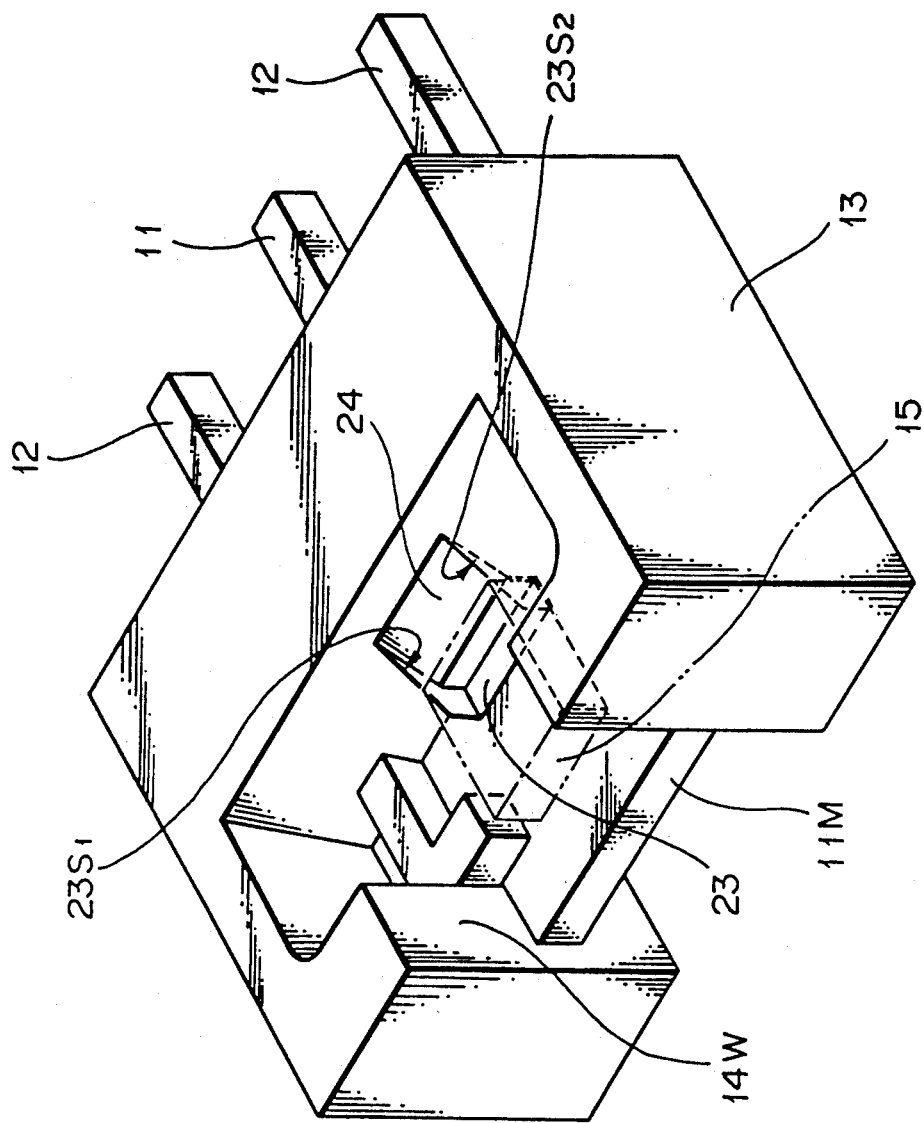
FIG. 8 is a perspective view illustrating a semiconductor laser device according to a third embodiment of the present invention in an enlarged scale.
Figure 9:
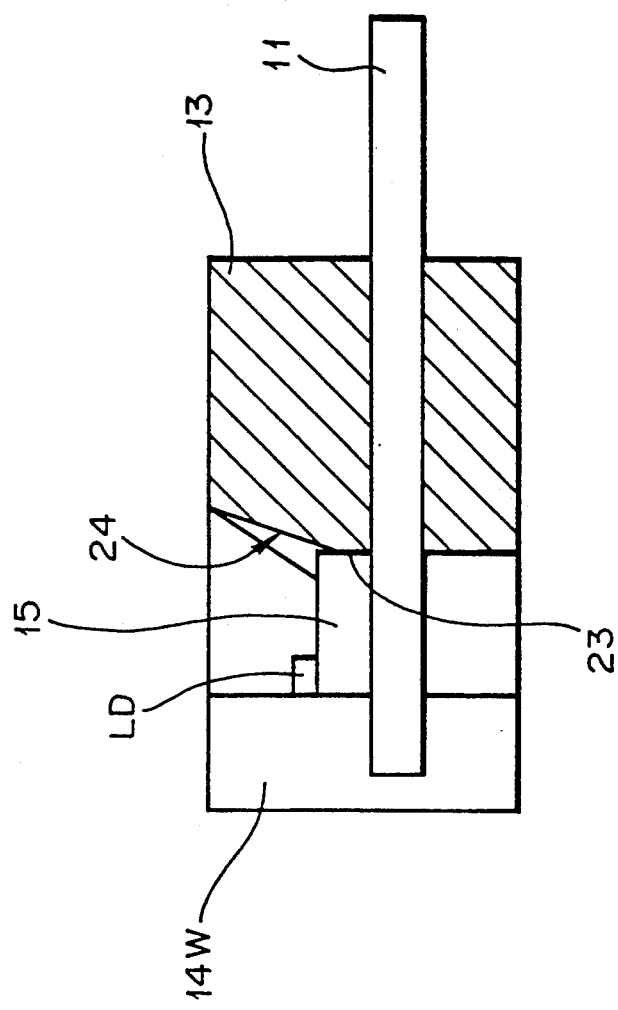
FIG. 9 is a schematic sectional view of an essential part of the semiconductor laser device shown in FIG. 8.

FIG. 8 of the accompanying drawings shows a perspective view of a semiconductor laser device according to the third embodiment of the present invention, and FIG. 9 shows a schematic sectional view of an essential part of the semiconductor laser device shown in FIG. 8.

The third embodiment differs from the first embodiment in a point that the position of the sub-mount substrate 15, that is, the semiconductor laser LD is defined by the recess portion 14 within which the semiconductor laser LD or the sub-mount substrate 15 mounting the semiconductor laser LD is disposed.

Referring to FIGS. 8 and 9, a pair of opposing side walls 23S1 and 23S2 are formed within the recess portion 14 so as to abut against the side walls of the sub-mount substrate 15. Further, the recess portion 14 is provided, at least at a bottom portion of the recess portion 14, with a position defining recess 23 for fitting to the sub-mount substrate 15.

The recess portion 14 is furthermore provided, at a rear wall of the recess portion 14 or a rear wall of the position defining recess 23, with a slanted reflection wall for preventing the laser beam radiated from the rear end of the resonator of the semiconductor laser LD from being reflected and incident on the resonator as a return beam. The slanted reflection wall may be a taper wall 24 slanted upwardly, for example.

As described above, in accordance with the above-described embodiments, the semiconductor laser LD and, if provided, the photo diode PD serving as a photo detecting element for monitoring the output laser beam therefrom are not directly molded by a resin mold. But, within the recess portion 14 of the resin mold body 13, there are disposed the semiconductor laser LD, the photo diode PD, and the bonding portions for bonding the lead wires 18 connecting the laser and the diode or the like to the leads 11 and 12, so that the laser and the diode are indirectly surrounded by the resin mold body 13 and so protected by the resin mold body 13.

As set out above, according to the present invention, the semiconductor laser LD and, if provided, the photo diode PD serving as a photo detecting element for monitoring the laser output beam therefrom are disposed within the recess portion 14 of the resin mold body 13 for holding the leads 11 and 12 so that the laser and diode or the like are indirectly surrounded by the resin mold body 13 with a space therebetween. Thus, the semiconductor laser LD, the photo diode PD, and the bonding portions for bonding the lead wires 18 connecting the laser and the diode to the leads 11 and 12 can be protected by the resin mold body 13.

The laser beam L radiated from the front end portion of the semiconductor laser LD is introduced out of the laser device without being disturbed by the resin mold body 13 and so on, so that the laser beam of the semiconductor laser LD can be surely introduced outwardly regardless of the shape, surface property, and other optical property of the resin mold body 13. When black resin such as epoxy resin colored by carbon black or the like is employed as the molding material, the resin mold body 13 is advantageous in cost and heat radiation property.

The semiconductor laser LD is prevented from being applied with stress from the resin mold body 13, so that the semiconductor laser device having stable characteristics can be provided.

In the assembling process of the semiconductor laser device, the molding of the lead frame is performed by a so-called outsert molding process in a manner that respective sets of leads 11 and 12 are sequentially molded by the resin mold body 13, so that plural sets of semiconductor laser devices can be molded simultaneously. Thus, the present invention is advantageous in reliability due to the simplified configuration and in mass productivity when compared with the semiconductor laser device prepared by the can seal molding process.

Further, the semiconductor laser LD can be surely positioned to a predetermined portion, e.g., mounting portion of the optical pickup portion by the reference planes 13F, 13B, 13U, 13S1 and 13S2 which are formed on the outer surfaces of the resin mold body 13 and the lead 11 projected from the body 13. Thus, the optical axis of the semiconductor laser LD can be accurately aligned with a predetermined line. Further, the projected portions of the lead 11 improve the heat radiation property of the resin mold body 13.

The rear wall of the recess portion 14 of the resin mold body 13 in which the semiconductor laser LD is disposed is processed to form the taper wall 24, so that the laser beam radiated from the rear end of the resonator of the semiconductor laser LD is prevented from being reflected and incident on the resonator as a return beam. Thus, it is possible to prevent noise due to the return beam from being included in the laser beam. Further, undesirable reflection of the laser beam from the taper wall 24 can be prevented by coloring the taper wall 24 with black or employing black resin as the resin mold body 13.

Furthermore, since the semiconductor laser LD is not buried in the resin mold body 13 but indirectly surrounded by the mold body 13 with a space therebetween, it is possible to provide various functions by the resin mold body 13.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

We claim:

1. A semiconductor laser device comprising:
   a first lead member having a mounting portion for mounting a semiconductor laser;
   at least one second lead member to be connected to said semiconductor laser;
   a resin mold member for unitarily molding said first and second lead members, wherein said resin mold member has a recess portion for receiving said semiconductor laser therein and for exposing therein said mounting portion of said first lead member and a part of said second lead member, and wherein said semiconductor laser is electrically connected to said first and second lead members within said recess portion; and wherein a rear wall of said recess portion of said resin mold body in which said semiconductor laser is disposed is processed to form a taper wall so that a laser beam radiated from a rear end of said semiconductor laser is prevented from being reflected and incident on a resonator of said semiconductor laser as a return beam.

2. A semiconductor laser device according to claim 1, wherein said resin mold member is made of black resin material.

3. A semiconductor laser device according to claim 1, wherein said resin mold member has reference planes for positioning said semiconductor laser device to a predetermined portion of an apparatus in which said semiconductor laser device is assembled.

4. A semiconductor laser device comprising:
a first lead member having a mounting portion for mounting a semiconductor laser and a photo detecting element for detecting a laser beam radiated from said semiconductor laser;
at least one second lead member to be connected to said semiconductor laser and said photo detecting element;
a resin mold member for unitarily molding said first and second lead members, wherein said resin mold member has a recess portion for receiving both said semiconductor laser and said photo detecting element therein and for exposing therein said mounting portion of said first lead member and a part of said second lead member, and wherein both said semiconductor laser and said photo detecting element are mounted on said mounting portion of said first lead member and electrically connected to said second lead member within said recess portion; and
wherein a rear wall of said recess portion of said resin mold body in which said semiconductor laser is disposed to form a taper wall so that a laser beam radiated from a rear end of said semiconductor laser is prevented from being reflected and incident on a resonator of said semiconductor laser as a return beam.

5. A semiconductor laser device according to claim 4, wherein said mounting portion has a bonding pad portion exposed within said recess portion for electrically connecting said photo detecting element to said second lead member therethrough, and a surface of said bonding pad portion is deposited by a metal surface layer formed by metal having good corrosion resistivity.

6. A semiconductor laser device according to claim 4, wherein said resin mold member is made of black resin material.

7. A semiconductor laser device according to claim 4, wherein said resin mold member has reference planes for positioning said semiconductor laser device to a predetermined portion of an apparatus in which said semiconductor laser device is assembled.

8. A laser device, comprising:
a first lead;
laser means, affixed to said first lead and electrically connected to said first lead, for providing a laser beam;
at least one second lead located in a first position relative to said first lead, said second lead being electrically connected to said laser means;
encapsulating means for rigidly encapsulating portions of said first and second leads to maintain said first position of said second lead relative to said first lead, said encapsulating means including an aperture for exposing said laser means thereby enabling said laser means to emit said laser beam through said aperture; and
wherein said encapsulating means includes at least one reference plane indicative of a position of said laser beam relative to said reference plane.

9. The laser device according to claim 8, wherein said aperture includes an angled surface for reflecting said laser beam.

10. The laser device according to claim 8, wherein said encapsulating means is a resin mold.

11. The laser device according to claim 8, wherein said encapsulating means is fabricated from a black resin material.

12. The laser device according to claim 8 further including a photo detecting element.

13. The laser device according to claim 8, wherein said first lead includes a transverse member to form a T-shape, said transverse member including opposed ends which are encapsulated by said encapsulating means.

14. The laser device according to claim 13, wherein said laser means is affixed between said opposed ends.

15. A laser device, comprising:
a first lead;
laser means, affixed to said first lead and electrically connected to said first lead, for providing a laser beam;
at least one second lead located in a first position relative to said first lead, said second lead being electrically connected to said laser means;
encapsulating means for rigidly encapsulating portions of said first and second leads to maintain said first position of said second lead relative to said first lead, said encapsulating means including an aperture for exposing said laser means thereby enabling said laser means to emit said laser beam through said aperture; and
wherein said aperture includes an angled surface for reflecting said laser beam.

16. The laser device according to claim 15, wherein said encapsulating means is a resin mold.

17. The laser device according to claim 15, wherein said encapsulating means is fabricated from a black resin material.

18. The laser device according to claim 15, further including a photo detecting element.

19. The laser device according to claim 15, wherein said first lead includes a transverse member to form a T-shape, said transverse member including opposed ends which are encapsulated by said encapsulating means.

20. The laser device according to claim 19 wherein said laser means is affixed between said opposed ends.

21. The laser device according to claim 15 wherein said encapsulating means includes at least one reference plane indicative of a position of said laser beam relative to said reference plane.

22. A laser device, comprising:
a first lead;

laser means, affixed to said first lead and electrically connected to said first lead, for providing a laser beam;

at least one second lead located in a first position relative to said first lead, said second lead being electrically connected to said laser means;

encapsulating means for rigidly encapsulating portions of said first and second leads to maintain said first position of said second lead relative to said first lead, said encapsulating means including an aperture for exposing said laser means thereby enabling said laser means to emit said laser beam through said aperture; and wherein said first lead includes a transverse member to form a T-shape, said transverse member including opposed ends which are encapsulated by said encapsulating means.

23. The laser device according to claim 22, wherein said encapsulating means includes a recess portion having a tapered rear wall, so that a laser beam radiated from a rear end of said semiconductor laser is prevented from being reflected and incident on a resonator of said laser device as a return beam.

24. The laser device according to claim 22, wherein said encapsulating means is a resin mold.

25. The laser device according to claim 22, wherein said encapsulating means is fabricated from a black resin material.

26. The laser device according to claim 22, further including a photo detecting element.

27. The laser device according to claim 22, wherein said laser means is affixed between said opposed ends.

28. The laser device according to claim 22, wherein said encapsulating means includes at least one reference plane indicative of a position of said laser beam relative to said reference plane.

* * * * *